(12) United States Patent
Nishikawa et al.

(10) Patent No.: US 11,808,815 B2
(45) Date of Patent: Nov. 7, 2023

(54) BATTERY STATE ESTIMATION DEVICE, BATTERY STATE ESTIMATION METHOD, AND BATTERY SYSTEM

(71) Applicant: Panasonic Intellectual Property Management Co., Ltd., Osaka (JP)

(72) Inventors: Shinya Nishikawa, Osaka (JP); Tohru Watanabe, Gifu (JP); Takashi Iida, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 366 days.

(21) Appl. No.: 17/311,373

(22) PCT Filed: Nov. 13, 2019

(86) PCT No.: PCT/JP2019/044535
§ 371 (c)(1),
(2) Date: Jun. 7, 2021

(87) PCT Pub. No.: WO2020/129478
PCT Pub. Date: Jun. 25, 2020

(65) Prior Publication Data
US 2022/0026498 A1 Jan. 27, 2022

(30) Foreign Application Priority Data
Dec. 18, 2018 (JP) .................. 2018-236658

(51) Int. Cl.
*G01R 31/3842* (2019.01)
*G01R 31/367* (2019.01)
(Continued)

(52) U.S. Cl.
CPC .......... *G01R 31/3842* (2019.01); *B60L 58/12* (2019.02); *G01R 31/367* (2019.01);
(Continued)

(58) Field of Classification Search
None
See application file for complete search history.

(56) References Cited

U.S. PATENT DOCUMENTS

2015/0369869 A1  12/2015  Tsuzuku et al.
2019/0181510 A1*  6/2019  Takahashi ............. H01M 10/48

FOREIGN PATENT DOCUMENTS

| JP | 2014-059206 | 4/2014 |
| JP | 2014-163861 | 9/2014 |
| JP | 2016-075572 | 5/2016 |

OTHER PUBLICATIONS

International Search Report of PCT application No. PCT/JP2019/044535 dated Feb. 4, 2020.

* cited by examiner

*Primary Examiner* — Jas A Sanghera
(74) *Attorney, Agent, or Firm* — McDermott Will & Emery LLP

(57) ABSTRACT

A voltage of a battery cell is measured, and a current flowing through the battery cell is measured. An open circuit voltage (OCV) of the battery cell is estimated based on the measured voltage, the measured current, and an equivalent circuit model based on electrochemistry of the battery cell, and a state of charge (SOC) of the battery cell is estimated based on the estimated OCV, SOC-OCV characteristics on a charge side of the battery cell, and SOC-OCV characteristics on a discharge side of the battery cell. At least one of a positive electrode and negative electrode of the battery cell is a mixed electrode containing a plurality of materials. Estimated is a current flowing through a material in which capacity-OCV characteristics are different between the charge side and the discharge side, the material being included in the plurality of materials contained in the mixed electrode, and a ratio between the SOC-OCV characteristics (Continued)

on the charge side and the SOC-OCV characteristics on the discharge side is determined based on the current.

6 Claims, 6 Drawing Sheets

(51) Int. Cl.
    *B60L 58/12*          (2019.01)
    *H02J 7/00*          (2006.01)
    *H01M 10/44*        (2006.01)
    *H01M 10/48*        (2006.01)
    *H02J 7/02*          (2016.01)
(52) U.S. Cl.
    CPC ........... *H01M 10/44* (2013.01); *H01M 10/48* (2013.01); *H02J 7/0048* (2020.01); *H01M 2220/20* (2013.01); *H02J 7/02* (2013.01)

(a)

(b)

SOC-OCV curve

SiO_Q-OCV curve (a)          (b)

(a)

(b)

BATTERY STATE ESTIMATION DEVICE, BATTERY STATE ESTIMATION METHOD, AND BATTERY SYSTEM

CROSS-REFERENCE TO RELATED APPLICATIONS

This application is a U.S. national stage application of the PCT International Application No. PCT/JP2019/044535 filed on Nov. 13, 2019, which claims the benefit of foreign priority of Japanese patent application No. 2018-236658 filed on Dec. 18, 2018, the contents all of which are incorporated herein by reference.

TECHNICAL FIELD

The present invention relates to a battery state estimation device, a battery state estimation method, and a battery system for estimating a state of a battery cell such as a lithium-ion battery.

BACKGROUND ART

In a secondary battery such as a lithium-ion battery, it is required to accurately estimate a state of charge (SOC). Generally, the SOC is uniquely associated with an open circuit voltage (OCV). Particularly, in a secondary battery mounted on an electrified vehicle such as a hybrid vehicle (HV), a plug-in hybrid vehicle (PHV), and an electric vehicle (EV), it is important to accurately estimate the SOC and the OCV for obtaining the SOC in order to accurately grasp a travelable distance.

In recent years, in order to increase a battery capacity, a lithium-ion battery cell using a negative electrode in which graphite (C) and silicon (Si) are mixed with each other has been developed. Due to characteristics of silicon (Si), a convergence curve of the OCV after the stop of charge and a convergence curve of the OCV after the stop of discharge are different from each other. Hence, the SOC and the OCV cannot be uniquely associated with each other, and estimation accuracy of the SOC decreases even if the OCV can be correctly estimated.

Heretofore, there have been proposed a method of selecting a plurality of OCV curves based on a current history and a method of estimating an SOC based on transient characteristics of each SOC (see, for example, PTLs 1 to 3).

CITATION LIST

Patent Literature

PTL 1: Unexamined Japanese Patent Publication No. 2014-163861

PTL 2: Unexamined Japanese Patent Publication No. 2016-75572

PTL 3: Unexamined Japanese Patent Publication No. 2014-59206

SUMMARY OF THE INVENTION

In the negative electrode in which graphite (C) and silicon (Si) are mixed with one another, transient characteristics depend on an amount of current flowing through silicon (Si). In the conventional method, the SOC is estimated based on transient characteristics corresponding to an observed current flowing through the entire secondary battery, and in the secondary battery using the electrode in which the plurality of materials are mixed with one another, the estimation accuracy of the SOC has decreased.

The present invention has been made in view of such a circumstance, and an object thereof is to provide a technique for improving the estimation accuracy of the SOC of the secondary battery using the electrode in which the plurality of materials are mixed with one another.

In order to solve the above problem, a battery state estimation device according to a certain aspect of the present invention includes: a voltage measuring unit that measures a voltage of a battery cell; a current measuring unit that measures a current flowing through the battery cell; and a controller that estimates an open circuit voltage (OCV) of the battery cell based on a voltage measured by the voltage measuring unit, a current measured by the current measuring unit, and an equivalent circuit model based on electrochemistry of the battery cell, and estimates a state of charge (SOC) of the battery cell based on the estimated OCV, SOC-OCV characteristics on a charge side of the battery cell, and SOC-OCV characteristics on a discharge side of the battery cell. At least one of a positive electrode and negative electrode of the battery cell is a mixed electrode containing a plurality of materials, and the controller estimates a current flowing through a material in which capacity-OCV characteristics are different between the charge side and the discharge side, the material being included in the plurality of materials contained in the mixed electrode, and determines a ratio between the SOC-OCV characteristics on the charge side and the SOC-OCV characteristics on the discharge side based on the current.

Note that any desired combinations of the above-described constituent elements and modifications of the features of the present invention in methods, devices, systems, computer programs, or other entities are still effective as other aspects of the present invention.

According to the present invention, the estimation accuracy of the SOC of the secondary battery using the electrode in which the plurality of materials are mixed with one another can be improved.

DESCRIPTION OF EMBODIMENT

Figure 1:
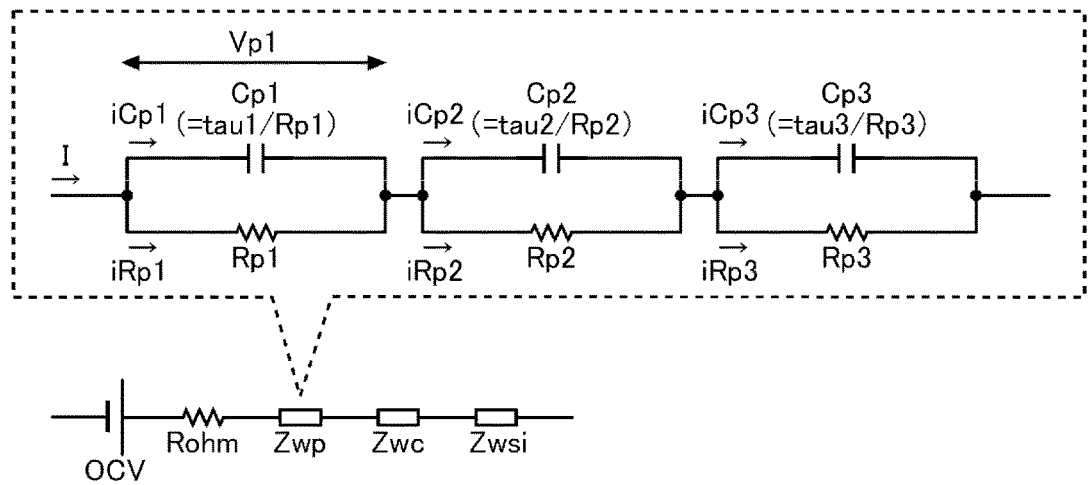
FIG. 1 is a diagram illustrating an example of an equivalent circuit model of a battery cell according to a comparative example.

FIG. 1 is a diagram illustrating an example of an equivalent circuit model of battery cell 10 according to a comparative example. In the present exemplary embodiment, assumed will be an example of using, as battery cell 10, a lithium-ion battery cell using lithium cobaltate (LiCoO2) for the positive electrode and a mixed material of graphite (C) and silicon (Si) for the negative electrode. The equivalent circuit model illustrated in FIG. 1 is an equivalent circuit model in which diffusion resistance components of the respective materials are simply arranged in series. The equivalent circuit model illustrated in FIG. 1 can be defined by the following (Equation 1).

$$OCV = CCV - I*Rohm - Vpp - Vpc - Vpsi \quad \text{(Equation 1)}$$

CCV is an observed voltage of battery cell 10, which is measured. I is an observed current of battery cell 10, which is measured. Rohm is a resistance component that collectively expresses a reaction resistance, conduction resistance, current collector resistance, and the like of lithium (Li). Zwp indicates a diffusion resistance component of lithium (Li) in a positive electrode active material, Zwc indicates a diffusion resistance component of lithium (Li) in a negative electrode active material (graphite (C)), and Zwsi indicates a diffusion resistance component of lithium (Li) in a negative electrode active material (silicon (Si)). Vpp indicates polarization voltage Vp applied to Zwp, Vpc indicates polarization voltage Vp applied to Zwc, and Vpsi indicates polarization voltage Vp applied to Zwsi.

In the following description of the equivalent circuit model, it is assumed that respective parameters which are R, C, and Zw have been tuned to values, which consider temperature dependencies thereof, according to an operating environment.

Each of the diffusion resistance components is expressed by a Warburg impedance, and is known to be capable of being approximated by a sum of infinite series of RC parallel circuits as in the following (Equation 2).

$$Zw(s) = \Sigma_{n=1 \text{ to } \infty}(Rn/(sCnRn+1)) \quad \text{(Equation 2)}$$

$$Cn = Cd/2, Rn = 8Rd/((2n-1)^2\pi^2)$$

A time constant is $(2n-1)^2$, and decreases as an order thereof increases. In the case of using the time constant in computational processing on the order of seconds, approximately third to fifth order is basically sufficient.

Each of the diffusion resistance components can be approximated by a Foster-type circuit as shown in the above (Equation 2). FIG. 1 illustrates an example of approximating each of the diffusion resistance components by a third-order Foster-type circuit. In each of RC parallel circuits of the Foster-type circuit, a relationship shown in the following (Equation 3) is established. The following (Equation 3) illustrates an RC parallel circuit at a first stage of the Foster-type circuit of FIG. 1.

$$(dVp1/dt) = (I/Cp1) - (Vp1/tau1) \quad \text{(Equation 3)}$$

$$iCp1 = Cp1(dVp1/dt), iRp1 = Vp1/Rp1, I = iCp1 + iRp1,$$
$$tau1 = Cp1*Rp1$$

When parameters which are Rp1 and Cp1 at a first stage of the above (Equation 3) are determined, parameters (Rp2, Cp2, Rp3, Cp3) at a subsequent stage thereof are also automatically determined. In each of the RC parallel circuits at a second stage and a third stage, a similar relational equation to the above (Equation 3) of the RC parallel circuit at the first stage is established. That is, from the above (Equation 2), $Cp1 = Cp2 = Cp3$, $Rp2 = \frac{1}{9}*Rp1$, and $Rp3 = \frac{1}{25}*Rp$ are satisfied.

Based on the above (Equation 2) and (Equation 3), by using observed current I as an input, polarization voltage Vpp applied to Zwp, polarization voltage Vpc applied to Zwc, and polarization voltage Vpsi applied to Zwsi can be calculated. The OCV can be estimated by substituting the calculated Vpp, Vpc and Vpsi for the above (Equation 1). In the case of estimating the OCV after the charge/discharge is stopped, 0 is substituted for I.

Figure 2:
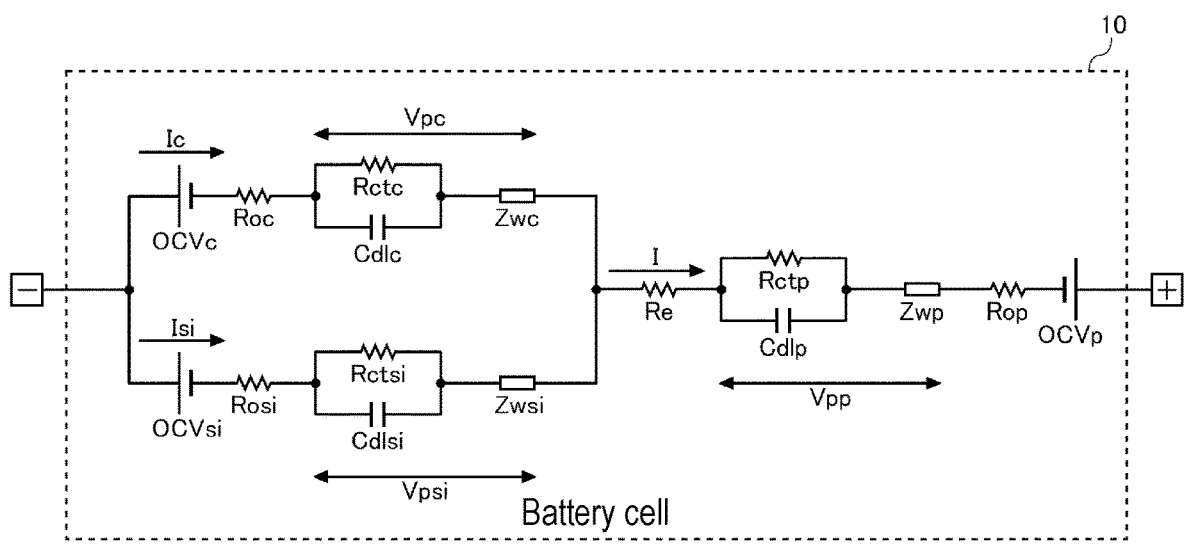
FIG. 2 is a diagram illustrating a first example of an equivalent circuit model of a battery cell according to the present exemplary embodiment.

FIG. 2 is a diagram illustrating a first example of the equivalent circuit model of battery cell 10 according to the present exemplary embodiment. In the equivalent circuit model illustrated in FIG. 2, an equivalent circuit is defined for each material, and an electrode in which a plurality of materials are mixed with one another is defined by a parallel circuit of equivalent circuits of the respective materials. In the present exemplary embodiment, a negative electrode is defined by a parallel circuit of an equivalent circuit of a graphite (C) negative electrode and an equivalent circuit of a silicon (Si) negative electrode.

In FIG. 2, Ro indicates a DC resistance component of a lead resistor or the like. Rct indicates a charge transfer resistance component associated with an electrode reaction. Cdl indicates a capacitance component corresponding to charge of an electric double layer. Re indicates a transfer resistance component (electrolytic solution resistance) in an electrolyte. Zw (Zwc, Zwsi, Zwp) indicates a diffusion resistance component, and as in the above comparative example, is expressed by a Warburg impedance, and is approximated by a third-order Foster-type circuit.

A voltage applied to both ends of a circuit that Rctc and Cdlc are in parallel with each other while Zwc is in series with the parallel combination of Rctc and Cdlc indicates polarization voltage Vpc of the graphite (C) negative electrode. Likewise, a voltage applied to both ends of a circuit that Rctsi and Cdlsi are in parallel with each other while Zwsi is in series with the parallel combination of Rctsi and Cdlsi indicates polarization voltage Vpsi of the silicon (Si) negative electrode. Likewise, a voltage applied to both ends of a circuit that Rctp and Cdlp are in parallel with each other while Zwp is in series with the parallel combination of Rctp and Cdlp indicates polarization voltage Vpp of the positive electrode.

Using the above (Equation 2) and (Equation 3), the polarization voltage applied to Zwp can be calculated based on observed current I. The polarization voltage applied to Zwc can be calculated based on current Ic flowing through the graphite (C). The polarization voltage applied to Zwsi can be calculated based on current Isi flowing through the silicon (Si). Current Ic flowing through the graphite (C) and current Isi flowing through the silicon (Si) can be calculated by solving, as a simultaneous equation, equations shown in the following (Equations 4) to (Equation 6).

As in the RC parallel circuit that constitutes a Foster-type circuit, also in the parallel circuit of Rct and Cdl, if parameters which are Rct and Cdl (which may be tau instead of C0 are determined, a polarization voltage applied to both ends of the parallel circuit of Rct and Cdl can be calculated using the above (Equation 3). Specifically, the polarization voltage applied to both ends of the parallel circuit of Rctp and Cdlp can be calculated based on observed current I. Based on current Ic flowing through graphite (C), the polarization voltage applied to both ends of the parallel circuit of Rctc and Cdlc can be calculated. The polarization voltage applied to both ends of the parallel circuit of Rctsi and Cdlsi can be calculated based on current Isi flowing through silicon (Si).

Polarization voltage Vpc of the graphite (C) negative electrode can be calculated by adding the polarization voltage applied to both ends of the parallel circuit of Rctc and Cdlc and the polarization voltage applied to Zwc. Likewise, polarization voltage Vpsi of the silicon (Si) negative electrode can be calculated by adding the polarization voltage applied to both ends of the parallel circuit of Rctsi and Cdlsi and the polarization voltage applied to Zwsi. Likewise, polarization voltage Vpp of the positive electrode can be calculated by adding the polarization voltage applied to both ends of the parallel circuit of Rctp and Cdlp and the polarization voltage applied to Zwp.

Since the equivalent circuit of the graphite (C) negative electrode and the equivalent circuit of the silicon (Si) negative electrode are parallel circuits, relationships in the following (Equation 4) and (Equation 5) are established.

$$OCV\_c(t)+Ic(t)*Roc(t)+Vpc(t-1)=OCV\_si(t)+Isi(t)*Rosi(t)+Vpsi(t-1) \quad \text{(Equation 4)}$$

$$Ic(t)+Isi(t)=I(t) \quad \text{(Equation 5)}$$

In order to simplify the calculation, previous values are used for the polarization voltage Vpc of the graphite (C) negative electrode and the polarization voltage Vpsi of the silicon (Si) negative electrode.

OCV_c in the above (Equation 4) can be derived as described below, and OCV_si can be derived from the following (Equation 6).

$$OCV\_c=OCV\_C\_LUT(Q\_c)$$

$$OCV\_si=OCV\_SI\_CHG\_LUT(Q\_si)*Xc(t-1)+OCV\_SI\_DIS\_LUT(Q\_si)*(1-Xc(t-1)) \quad \text{(Equation 6)}$$

OCV_C_LUT indicates a lookup table in which characteristic data of a Q-OCV curve of the graphite (C) negative electrode is described.

OCV_SI_CHG_LUT indicates a lookup table in which characteristic data of a Q-OCV curve on a charge side of the silicon (Si) negative electrode is described.

OCV_SI_DIS_LUT indicates a lookup table in which characteristic data of a Q-OCV curve on a discharge side of the silicon (Si) negative electrode is described.

Figure 3:
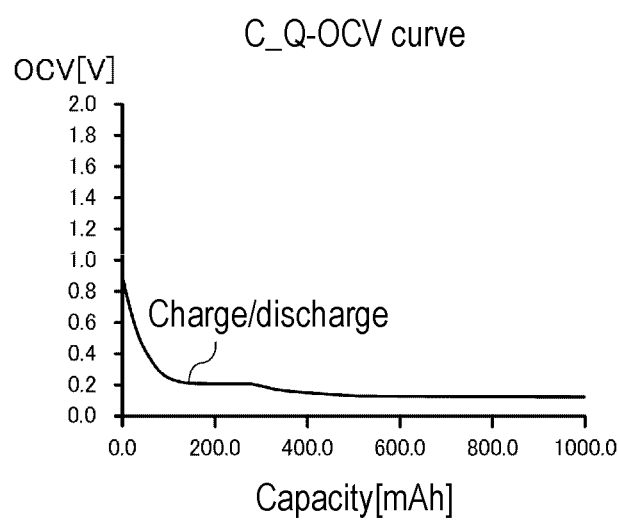
FIGS. 3(a) and 3(b) are diagrams showing an example of a Q-OCV curve of a graphite (C) negative electrode and a Q-OCV curve of a silicon monoxide (SiO) negative electrode.
Figure 3:
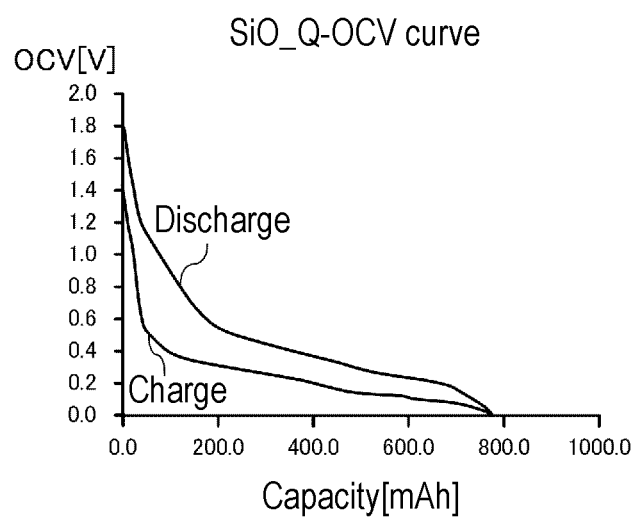

FIGS. 3(a) and 3(b) are diagrams showing examples of the Q-OCV curve of the graphite (C) negative electrode and a Q-OCV curve of a silicon monoxide (SiO) negative electrode. FIG. 3(a) shows an example of the Q-OCV curve of the graphite (C) negative electrode, and FIG. 3(b) shows an example of the Q-OCV curve of the silicon monoxide (SiO) negative electrode. In the example illustrated in FIG. 3(b), an example is described in which silicon monoxide (SiO) is used as a silicon (Si)-based material. Horizontal axes represent a capacity [mAh], and vertical axes represent OCV [V].

In the graphite (C) negative electrode, the Q-OCV curves during charge and discharge are substantially the same, and accordingly, are expressed by one curve. In the silicon monoxide (SiO) negative electrode, the Q-OCV curves during charge and discharge are different from each other, and accordingly, are expressed by two curves.

OCV_C_LUT, OCV_SI_CHG_LUT, and OCV_SI_DIS_LUT are generated based on such Q-OCV curves as described above.

Q_c and Q_si can be derived from the following (Equation 7) and (Equation 8).

$$Q\_c=Q\_c\_init+\Sigma Ic/FCC\_c \quad \text{(Equation 7)}$$

$$Q\_si=Q\_si\_init+\Sigma Isi/FCC\_si \quad \text{(Equation 8)}$$

Q_c_init indicates an initial capacity of the graphite (C) negative electrode, Q_c indicates a current capacity of the graphite (C) negative electrode, and FCC_c indicates a full charge capacity of the graphite (C) negative electrode. Q_si_init indicates an initial capacity of the silicon (Si) negative electrode, Q_si indicates a current capacity of the silicon (Si) negative electrode, and FCC_si indicates a full charge capacity of the silicon (Si) negative electrode.

The initial capacity of the graphite (C) negative electrode and the initial capacity of the silicon (Si) negative electrode are set so as to have a relationship of OCV_c=OCV_si.

Xc in the above (Equation 6) is a parameter indicating a ratio of charge OCV and discharge OCV. A method for deriving Xc will be described below. In the lithium-ion battery cell using the mixed negative electrode of graphite (C) and silicon (Si), the SOC-OCV curve on the charge side and the SOC-OCV curve on the discharge side are different from each other. Particularly in a region where the SOC is 20% or less, the two are greatly deviated from each other, and hysteresis occurs when switching is performed from discharge to charge or from charge to discharge. Note that, in the case of the graphite (C) negative electrode alone, the SOC-OCV curves on the discharge side and the charge side are substantially the same, and accordingly, hysteresis does not occur at the time of switching charge and discharge.

Figure 4:
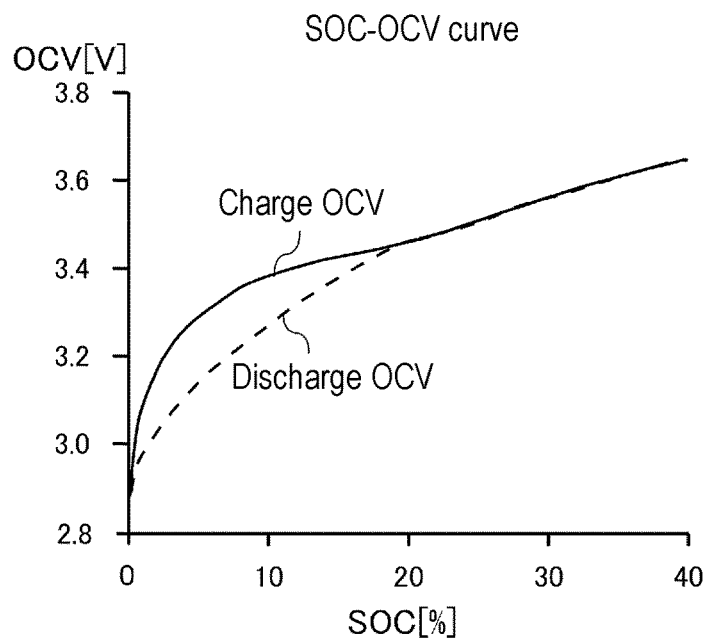
FIG. 4 is a diagram showing an example of SOC-OCV curves of a lithium-ion battery cell using a mixed negative electrode of graphite (C) and silicon (Si).

FIG. 4 is a diagram showing an example of the SOC-OCV curves of the lithium-ion battery cell using the mixed negative electrode of graphite (C) and silicon (Si). Horizontal axes represent the SOC [%], and vertical axes represent the OCV [V]. A solid line indicates the SOC-OCV curve on the charge side, and a dotted line indicates the SOC-OCV curve on the discharge side.

In the region where the SOC is 20% or less, a deviation occurs between the SOC-OCV curve on the charge side and the SOC-OCV curve on the discharge side. In this region, an actual OCV converges to any point in a range surrounded by the SOC-OCV curve on the charge side and the SOC-OCV curve on the discharge side. The region where the SOC is 20% or less is a region where silicon (Si) is more likely to react than graphite (C), and an influence of transient characteristics of silicon (Si) increases.

Xc=0 indicates a case where the OCV is located on such a discharge OCV curve, and Xc=1 indicates a case where the OCV is located on such a charge OCV curve. 0<Xc<1 indicates a case where the OCV is located between the discharge OCV curve and the charge OCV curve.

In the case of the silicon (Si) negative electrode alone, hysteresis characteristics at the time of switching from discharge to charge or from charge to discharge depend on an amount of current (current history). When the mixed negative electrode of graphite (C) and silicon (Si) is used, observed current I and current Isi flowing through silicon (Si) do not coincide with each other, and accordingly, in the conventional equivalent circuit model or the equivalent circuit model according to the comparative example illustrated in FIG. 1, the estimation accuracy of the OCV and the SOC of entire battery cell 10 decreases.

Figure 5:
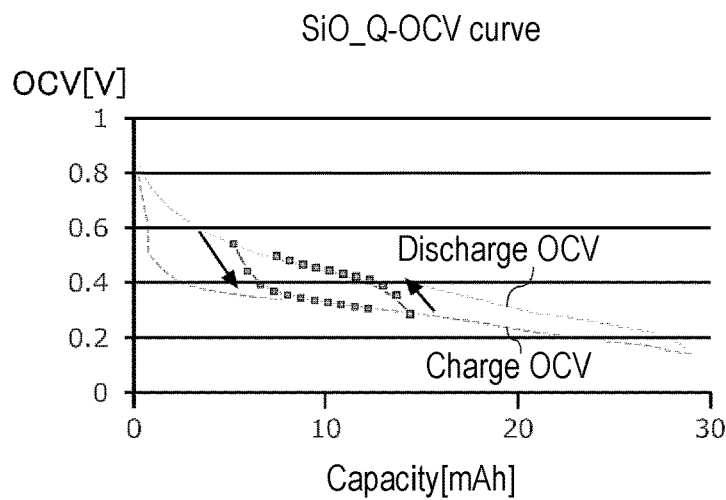
FIG. 5 is a diagram showing an example of hysteresis characteristics of the Q-OCV curve of the silicon monoxide (SiO) negative electrode.

FIG. 5 is a diagram showing an example of the hysteresis characteristics of the Q-OCV curve of the silicon monoxide (SiO) negative electrode. Horizontal axes represent a capacity [mAh], and vertical axes represent OCV [V]. The example illustrated in FIG. 5 is experimental data of the silicon monoxide (SiO) negative electrode alone, and the example illustrated in FIG. 3(b) is data converted into the case of an actual machine. Since weights of silicon monoxide (SiO) of the two are different from each other, capacities thereof are different from each other. In the example shown in FIG. 5, the full charge capacity is approximately 28 [mAh].

Hysteresis characteristics having a plurality of plots indicated by an upward arrow indicate hysteresis characteristics when switching is performed from charge to discharge. The example shown in FIG. 5 shows an example in which switching is performed from charge to discharge when the capacity is approximately 14 [mAh]. The charge OCV approaches the discharge OCV along a hysteresis curve that changes diffusely. In the example shown in FIG. 5, the charge OCV is switched to the discharge OCV with a width of approximately 3 [mAh].

Hysteresis characteristics having a plurality of plots indicated by a downward arrow indicate hysteresis characteristics when switching is performed from discharge to charge. The example shown in FIG. 5 shows an example in which switching is performed from discharge to charge when the capacity is approximately 6 [mAh]. The discharge OCV approaches the charge OCV along a hysteresis curve that changes diffusely.

As described above, in order to estimate the SOC with high accuracy, it is necessary to appropriately obtain Xc indicating an intermediate ratio between the charge OCV and the discharge OCV.

A linear change of Xc can be derived from the following (Equation 9).

$$Xc\_line(t)=Xc(t-1)+a*dQ \quad \text{(Equation 9)}$$

An exponential change of Xc at the time of switching from discharge to charge can be derived from the following (Equation 10).

$$Xc\_exp\_CHG(t):(Xc(t)-Xc(t-1))/dQ=P*(1-Xc(t-1)+Xc(T)) \quad \text{(Equation 10)}$$

An exponential change of Xc at the time of switching from charge to discharge can be derived from the following (Equation 11).

$$Xc\_exp\_DIS(t):(Xc(t)-Xc(t-1))/dQ=P*(Xc(t-1)+1-Xc(T)) \quad \text{(Equation 11)}$$

a in the above (Equation 9) and P in the above (Equation 10) and (Equation 11) are coefficients, where values derived in advance by experiments or simulations are set. dQ indicates a capacitance change in a Δt period. When periodically (discretely) calculated by a microcomputer or the like, dQ is substantially equivalent to a current. In the present exemplary embodiment, current Isi flowing through silicon (Si) is used as a substitute for dQ.

T is a parameter representing a time when switching is performed between charge and discharge where Xc is an intermediate value (0.2, 0.5, or the like) between 0 and 1. Xc(T) holds a value of Xc(t) when switching is performed between charge and discharge, and a value thereof is updated only when such switching between charge and discharge is performed.

Figure 6:
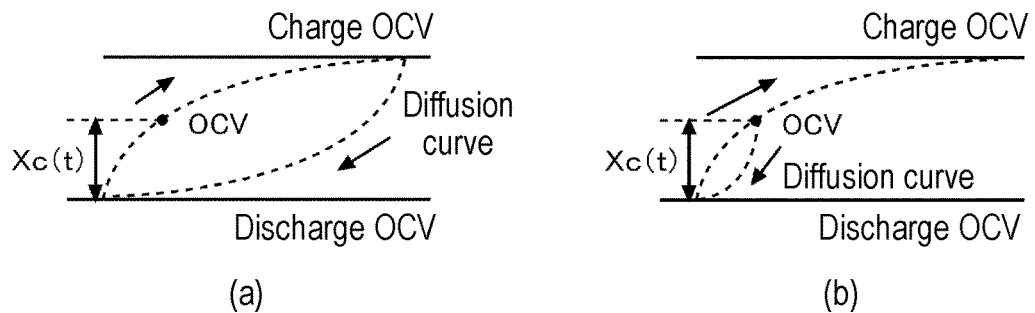
FIGS. 6(a) and 6(b) are diagrams for explaining transition of Xc(t).

FIGS. 6(a) and 6(b) are diagrams for explaining transition of Xc(t). FIG. 6(a) shows a trajectory of switching from charge to discharge and converging to the discharge OCV, that is, transition of Xc(t) when Xc(T)=1 in (Equation 11), and a trajectory of switching from discharge to charge and converging to the charge OCV, that is, transition of Xc(t) when Xc(T)=0 in (Equation 10). FIG. 6(b) shows a trajectory when another switching is performed from charge to discharge before switching is performed from discharge to charge and convergence to the charge OCV is made, that is, transition of Xc(t) when 0<Xc(T)<1 in (Equation 11).

Xc(t) can be derived from the following (Equation 12) or (Equation 13) at the time of charge or discharge, respectively.

$$Xc(t)=(X\_line(t)+Xc\_exp\_CHG(t))/2 \quad \text{(Equation 12)}$$

$$Xc(t)=(X\_line(t)+Xc\_exp\_DIS(t))/2 \quad \text{(Equation 13)}$$

The OCV of entire battery cell 10 illustrated in FIG. 2 can be estimated from the following (Equation 14).

$$OCV=CCV-I*Re-I*Rop-Vpp-Isi*Rosi-Vpsi \quad \text{(Equation 14)}$$

Since the equivalent circuit of the graphite (C) negative electrode and the equivalent circuit of the silicon (Si) negative electrode are parallel circuits, voltages applied to the two are basically the same. Note that, since the OCV also gradually changes due to polarization, a larger one of polarization voltage Vpc of the graphite (C) negative electrode and polarization voltage Vpsi of the silicon (Si) negative electrode is dynamically selected and used. Hence, 5th and 6th terms on a right side of the above (Equation 14) may sometimes be −Ic*Roc−Vpc.

The SOC of battery cell 10 illustrated in FIG. 2 can be estimated from the following (Equation 15).

$$SOC=OCV\_SOC\_CHG\_LUT(OCV)*Xc(t)+OCV\_SOC\_DIS\_LUT(OCV)*(1-Xc(t)) \quad \text{(Equation 15)}$$

OCV_SOC_CHG_LUT indicates a lookup table in which characteristic data of the SOC-OCV curve on the charge side of battery cell 10 illustrated in FIG. 2 is described.

OCV_SOC_DIS_LUT indicates a lookup table in which characteristic data of the SOC-OCV curve on the discharge side of battery cell 10 illustrated in FIG. 2 is described.

Figure 7:
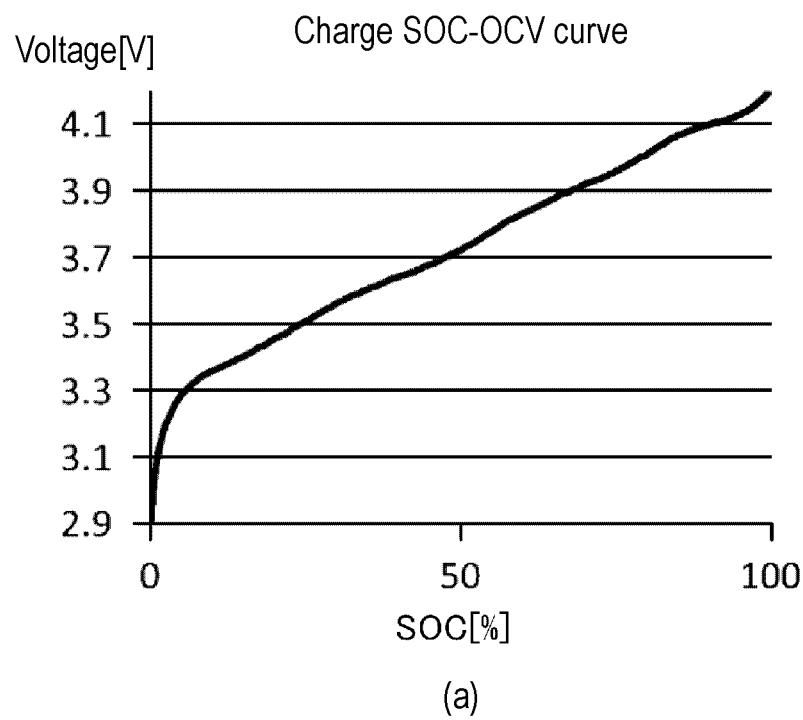
FIGS. 7(a) and 7(b) are diagrams showing an example of an SOC-OCV curve on a charge side and an SOC-OCV curve on a discharge side.
Figure 7:
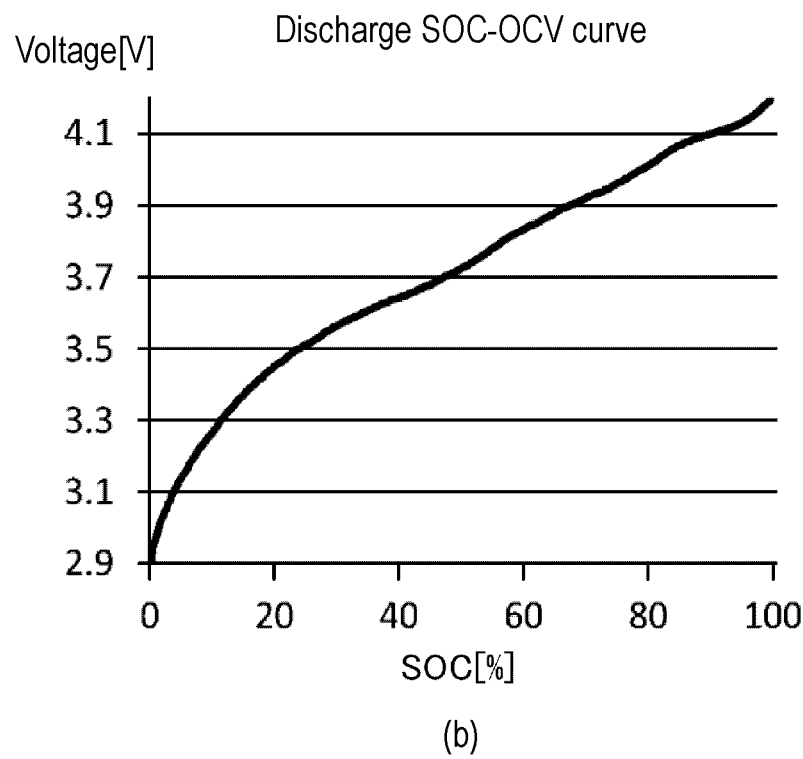

FIGS. 7(a) and 7(b) are diagrams showing examples of the SOC-OCV curve on the charge side and the SOC-OCV curve on the discharge side. FIG. 7(a) illustrates an example of the SOC-OCV curve on the charge side, and FIG. 7(b) illustrates an example of the SOC-OCV curve on the discharge side. Horizontal axes represent the SOC [%], and vertical axes represent the OCV [V].

Figure 8:
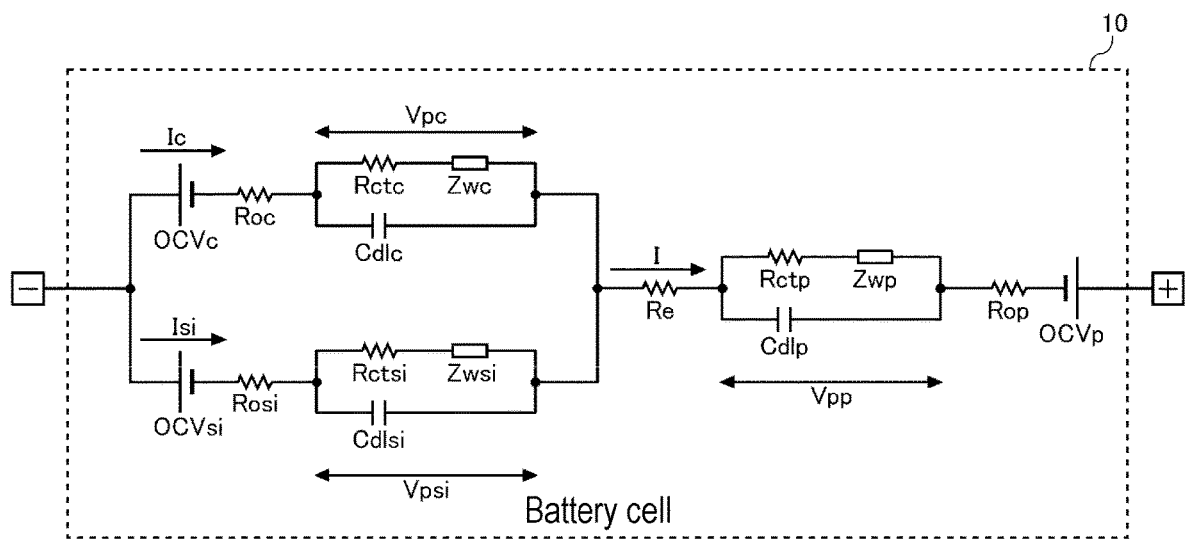
FIG. 8 is a diagram illustrating a second example of the equivalent circuit model of the battery cell according to the present exemplary embodiment.

FIG. 8 is a diagram illustrating a second example of the equivalent circuit model of battery cell 10 according to the present exemplary embodiment. The first example illustrated in FIG. 2 is an equivalent circuit model suitable for a case where the time constant of Zw is sufficiently larger than the time constant according to Cdl, and the second example illustrated in FIG. 8 is an equivalent circuit model suitable for a case where the time constant of Zw is not sufficiently larger than Cdl.

In the equivalent circuit of the positive electrode, combined impedance (Zp) of Rctp, Zwp, and Cdlp excluding OCV_p and Rop is a resistance component involved in polarization. In the equivalent circuit of the graphite (C) negative electrode, combined impedance (Zc) of Rctc, Zwc, and Cdlc excluding OCV_c and Roc is a resistance component involved in polarization. In the equivalent circuit of the silicon (Si) negative electrode, combined impedance (Zsi) of Rctsi, Zwsi, and Cdlsi excluding OCV_si and Rosi is a resistance component involved in polarization. Since the equivalent circuit of the graphite (C) negative electrode and the equivalent circuit of the silicon (Si) negative electrode constitute a parallel circuit, the CCV of the equivalent circuit of the graphite (C) negative electrode and the CCV of the equivalent circuit of the silicon (Si) negative electrode are basically the same.

The CCV of entire battery cell 10 illustrated in FIG. 8 can be defined by the following (Equation 16).

$$CCV=OCV\_p-OCV\_si+Isi*Zsi+Isi*Rosi+I*Zp+I*Rop+I*Re \quad \text{(Equation 16)}$$

The OCV of entire battery cell 10 is derived by OCV_p−OCV_si. Polarization voltage Vpsi of the silicon (Si) negative electrode is derived from Isi*Zsi. Since the equivalent circuit of the graphite (C) negative electrode and the equivalent circuit of the silicon (Si) negative electrode are parallel circuits, relationships in the following (Equation 17) and (Equation 18) are established.

$$I=Ic+Isi \quad \text{(Equation 17)}$$

$$OCV\_c+Ic*Zc+Ic*Roc=OCV\_si+Isi*Zsi+Isi*Rosi \quad \text{(Equation 18)}$$

In order to simplify the calculation, when the previous values are used for portions of Rct, Zw, and Cdl (polarization voltage Vp), the above (Equation 18) is rewritten as the following (Equation 19).

$$OCV\_c+Vpc+Ic*Roc=OCV\_si+Vpsi+Isi*Rosi \quad \text{(Equation 19)}$$

OCV_c can be derived from a lookup table of the Q-OCV curve of the graphite (C) negative electrode, and OCV_si can be derived from a lookup table of the Q-OCV curve of the silicon (Si) negative electrode. The capacity Q_c of the graphite (C) negative electrode and the capacity Q_si of the silicon (Si) negative electrode can be derived from the above (Equation 7) and (Equation 8). The initial capacity of the graphite (C) negative electrode and the initial capacity of the silicon (Si) negative electrode are set so as to have a relationship of OCV_c=OCV_si.

Figure 9:
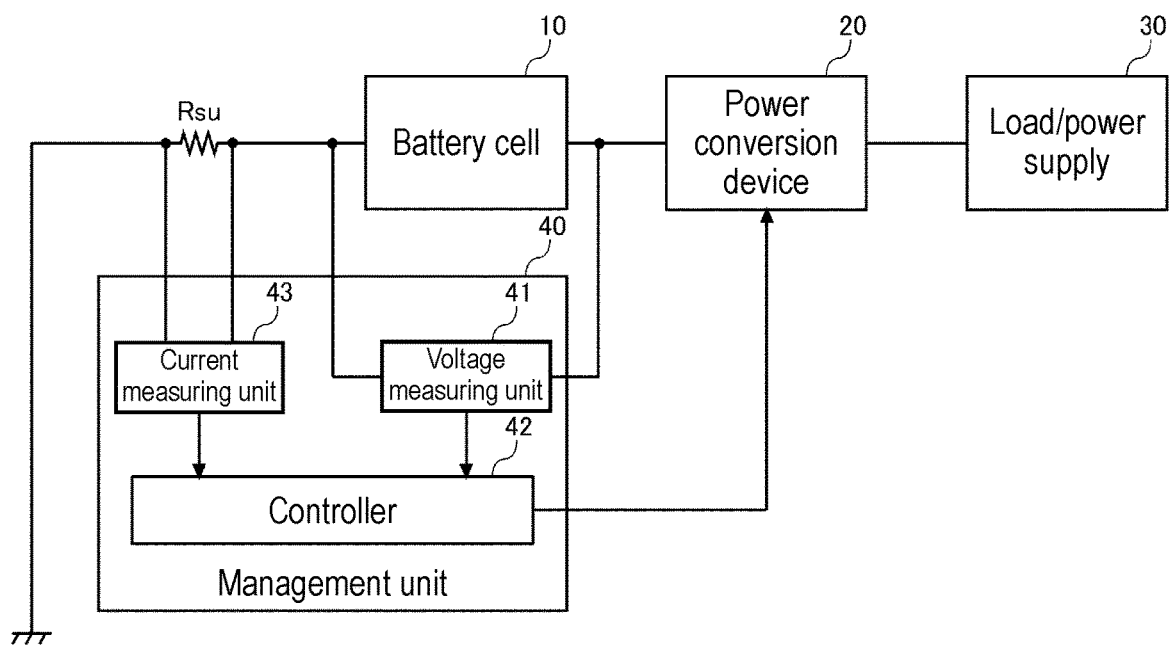
FIG. 9 is a diagram illustrating a basic circuit diagram for explaining charging/discharging of a battery cell according to an exemplary embodiment of the present invention.

FIG. 9 is a basic circuit diagram for explaining the charge/discharge of battery cell 10 according to the exemplary embodiment of the present invention. Battery cell 10 is connected to load/power supply 30 via power conversion device 20. Power conversion device 20 is, for example, a bidirectional inverter or a bidirectional DC/DC converter. Load/power supply 30 is, for example, an AC load, a DC load, an AC power supply, or a DC power supply.

For example, the bidirectional inverter as power conversion device 20 converts, into AC power, DC power discharged from battery cell 10, and supplies the AC load with the converted AC power. Moreover, the bidirectional inverter converts, into DC power, AC power supplied from an AC power supply (for example, a commercial power system or an AC generator), and stores the converted DC power in battery cell 10.

For example, the bidirectional DC/DC converter as power conversion device 20 converts DC power, which is discharged from battery cell 10, into DC power of another voltage, and supplies a DC load (including another storage battery or a capacitor) with the converted DC power. Moreover, the bidirectional DC/DC converter converts DC power, which is supplied from a DC power supply (for example, another storage battery, a capacitor, a solar cell, or a DC generator), into DC power of another voltage, and stores the converted DC power in battery cell 10.

Management unit 40 is a device that manages a state and charge/discharge of battery cell 10. Management unit 40 includes voltage measuring unit 41, controller 42, and current measuring unit 43. Voltage measuring unit 41 measures a voltage across battery cell 10 and outputs the voltage to controller 42. Current measuring unit 43 measures a current, which flows through battery cell 10, based on a voltage across shunt resistor Rsu inserted into a current path of battery cell 10, and outputs the current to controller 42. Note that a Hall element may be used in place of shunt resistor Rsu.

Controller 42 controls the charge/discharge of battery cell 10. Specifically, controller 42 sets a current command value or a voltage command value in power conversion device 20, thereby executing constant current charge (CC charge), constant voltage charge (CV charge), constant current discharge (CC discharge), or constant voltage discharging (CV discharge) of battery cell 10.

Power conversion device 20 includes a switching element, and controls a duty ratio of the switching element based on a current command value or a voltage command value, which is set from controller 42, thereby controlling a charging current, a charging voltage, a discharging current, or a discharging voltage.

Figure 10:
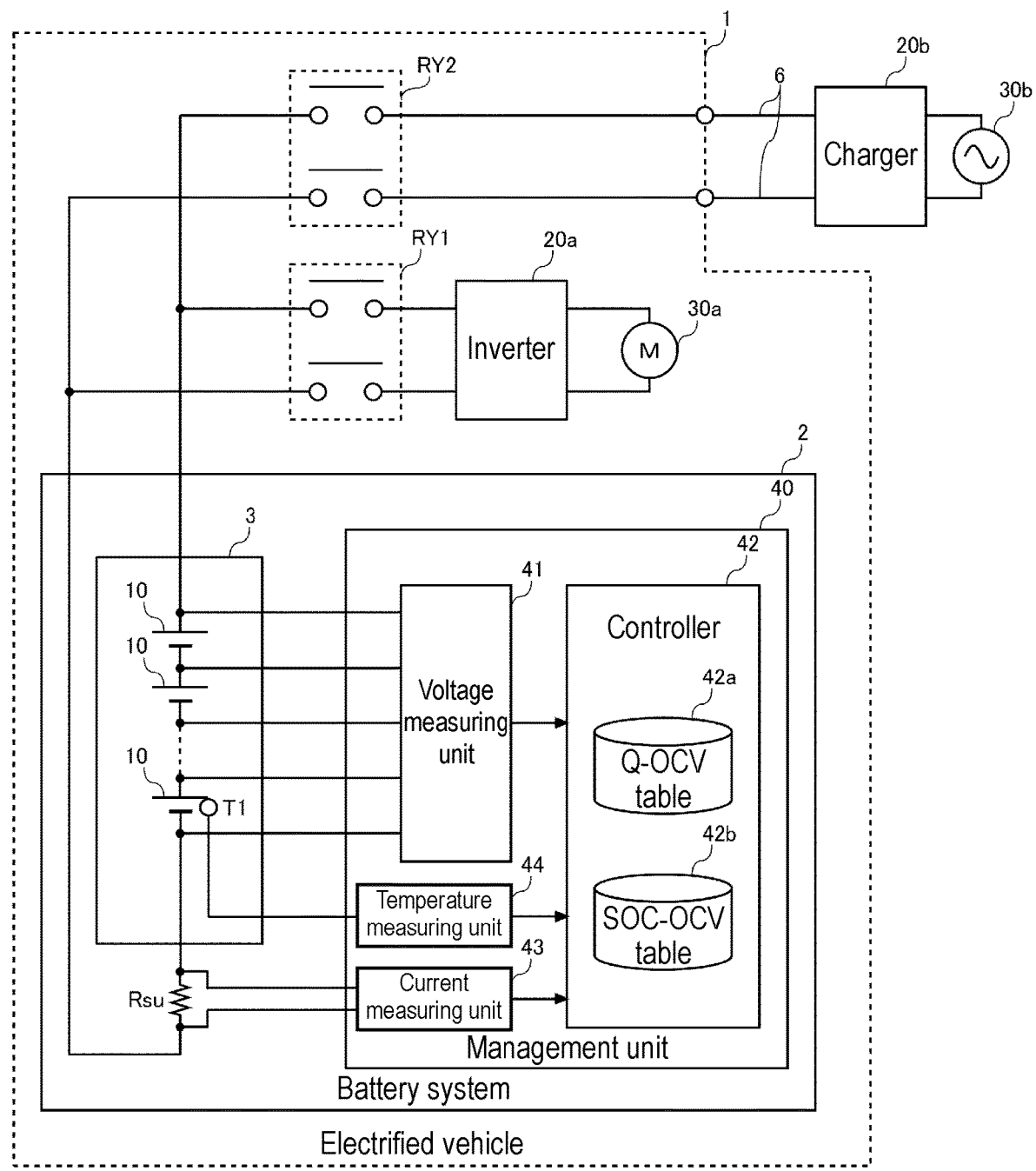
FIG. 10 is a diagram for explaining an electrified vehicle equipped with a battery system according to the exemplary embodiment of the present invention.

FIG. 10 is a diagram for explaining electrified vehicle 1 equipped with battery system 2 according to the exemplary embodiment of the present invention. Electrified vehicle 1 is assumed to be an EV/PHV chargeable from charger 20b installed outside.

Battery system 2 is connected to motor 30a via first relay RY1 and inverter 20a. During power running, inverter 20a converts DC power, which is supplied from battery system 2, into AC power, and supplies motor 30a with the AC power. During regeneration, inverter 20a converts AC power, which is supplied from motor 30a, into DC power, and supplies battery system 2 with the DC power. Motor 30a is a three-phase AC motor, and during power running, rotates according to the AC power supplied from inverter 20a. During regeneration, motor 30a converts rotational energy due to deceleration into AC power, and supplies inverter 20a with the AC power.

First relay RY1 is inserted between wires which connect battery module 3 and inverter 20a to each other. During traveling, management unit 40 of battery system 2 controls first relay RY1 to an on state (closed state), and electrically connects battery system 2 and a power system of electrified vehicle 1 to each other. During stop, in principle, management unit 40 controls first relay RY1 to an off state (open state), and electrically shuts off battery system 2 and the power system of electrified vehicle 1 from each other. Note that another type of switches such as semiconductor switches may be used in place of the relays.

Battery system 2 can be charged from commercial power system 30b by connecting with charging cable 6 to charger 20b installed outside electrified vehicle 1. Charger 20b is installed in a home, a car dealer, a service area, a commercial facility, a public facility, or the like. Charger 20b is connected to commercial power system 30b, and charges battery system 2, which is in electrified vehicle 1, via charging cable 6. In the vehicle, second relay RY2 is inserted between wires which connect battery system 2 and charger 20b to each other. Note that another type of switches such as semiconductor switches may be used in place of the relays. Management unit 40 of battery system 2 controls second relay RY2 to an on state (closed state) before the charge is started, and controls second relay RY2 to an off state (open state) after the charge is completed.

Generally, battery system 2 is charged with AC in the case of normal charge, and is charged with DC in the case of rapid charge. When battery system 2 is charged with AC, AC power is converted into DC power by an AC/DC converter (not shown) inserted between second relay RY2 and battery system 2.

Battery module 3 includes a plurality of battery cells 10. An example of using lithium-ion battery cells (nominal voltage: 3.6V to 3.7V) as battery cells 10 will be assumed below. A number of battery cells 10 connected in series is determined according to a driving voltage of motor 30a.

Shunt resistor Rsu is connected in series to the plurality of battery cells 10. Shunt resistor Rsu functions as a current detection element. Note that a Hall element may be used in place of shunt resistor Rsu. Moreover, temperature sensor T1 for detecting temperatures of the plurality of battery cells 10 is installed. For example, a thermistor can be used for temperature sensor T1.

Management unit 40 includes voltage measuring unit 41, controller 42, temperature measuring unit 44, and current measuring unit 43. Voltage measuring unit 41 and respective nodes of the plurality of battery cells 10 connected in series are connected to each other by a plurality of voltage lines. Voltage measuring unit 41 measures each voltage between two adjacent voltage lines, thereby measuring the voltage of each of battery cells 10. Voltage measuring unit 41 transmits the measured voltage of each of battery cells 10 to controller 42.

Since voltage measuring unit 41 has a high voltage with respect to battery controller 42, voltage measuring unit 41 and controller 42 are connected to each other in an insulated state by a communication line. Voltage measuring unit 41 can be composed of a general-purpose analog front-end IC or an application specific integrated circuit (ASIC). Voltage measuring unit 41 includes a multiplexer and an A/D converter. The multiplexer outputs each voltage between two adjacent voltage lines to the A/D converter in order from the top. The A/D converter converts each analog voltage, which is input from the multiplexer, into a digital value.

Temperature measuring unit 44 includes voltage dividing resistors and an A/D converter. The A/D converter converts voltages, which are divided by temperature sensor T1 and the voltage dividing resistors, into digital values, and outputs the digital values to controller 42. Controller 42 estimates the temperatures of the plurality of battery cells 10 based on the digital values.

Current measuring unit 43 includes a differential amplifier and an A/D converter. The differential amplifier amplifies a voltage across shunt resistor Rsu, and outputs the amplified voltage to the A/D converter. The A/D converter converts the voltage, which is input from the differential amplifier, into a digital value, and outputs the digital value to controller 42. Controller 42 estimates a current flowing through the plurality of battery cells 10 based on the digital value.

Note that, when the A/D converter is mounted in controller 42, and an analog input port is installed in controller 42, temperature measuring unit 44 and current measuring unit 43 may output an analog voltage to controller 42, and the analog voltage may be converted into a digital value by the A/D converter in controller 42.

Controller 42 manages battery module 3 based on the voltages, temperatures and currents of the plurality of battery cells 10, which are measured by voltage measuring unit 41, temperature measuring unit 44, and current measuring unit 43. Controller 42 can be composed of a microcomputer and a non-volatile memory (for example, an electrically erasable programmable read-only memory (EEPROM) or a flash memory). Q-OCV table 42a and SOC-OCV table 42b are held in the non-volatile memory.

Q-OCV table 42a is provided for each material for use in the positive electrode and the negative electrode. In the present exemplary embodiment, a Q-OCV table of the positive electrode, a Q-OCV table of the graphite (C) negative electrode, a Q-OCV table of the silicon (Si) negative electrode on the charge side, and a Q-OCV table of the silicon (Si) negative electrode on the discharge side are provided. Moreover, in the present exemplary embodiment, SOC-OCV table 42b has an SOC-OCV table on the charge side of battery cell 10 and an SOC-OCV table on the discharge side thereof, both of which are provided separately from each other.

Controller 42 estimates the SOC of battery cell 10 based on the voltage measured by voltage measuring unit 41, the current measured by current measuring unit 43, and the equivalent circuit model of battery cell 10. As the equivalent circuit model of battery cell 10, the equivalent circuit models illustrated in FIGS. 2 and 8 can be used. Finally, the SOC can be estimated by the above (Equation 15). The respective parameters which are R, C, and Zw for use in the equivalent circuit models are derived in advance by experiment or simulation. At that time, temperature dependency of each parameter is also derived. Controller 42 adjusts the value of each parameter based on the temperature measured by temperature measuring unit 44.

As described above, according to the present exemplary embodiment, the lithium-ion battery cell using the mixed negative electrode of graphite (C) and silicon (Si) is expressed by the equivalent circuit model including the parallel circuit of the equivalent circuit of the graphite (C) negative electrode and the equivalent circuit of the silicon (Si) negative electrode, whereby the current input/output to/from silicon (Si) can be estimated.

Transient characteristics of the SOC-OCV curve on the charge side and the SOC-OCV curve on the discharge side depend on the current input/output to/from silicon (Si) having hysteresis at the time of charge/discharge switching. Hence, the transient characteristics of the SOC-OCV curve on the charge side and the SOC-OCV curve on the discharge side are estimated from the current history to silicon (Si), whereby the SOC can be estimated with high accuracy.

The CCV characteristics are used in the method disclosed in PTL 1 described above, but the OCV curve is used in the present exemplary embodiment. Thus, the estimation accuracy of the SOC can be improved without depending on a specific charge/discharge pattern. Moreover, in the method disclosed in PTL 1 described above, the transient characteristics are defined as a correlation function of the SOC, but in the present exemplary embodiment, the transient characteristics are defined by the parallel circuit model. Thus, the correlation of the current can also be expressed, and the estimation accuracy of the SOC can be improved.

In the method disclosed in the above PTL 2 described above, one of the charge OCV curve and the discharge OCV curve is selected according to the immediately preceding charge/discharge state. In contrast, in the present exemplary embodiment, the charge OCV curve and the discharge OCV curve are subjected to weighted average, and accordingly, the intermediate value can be covered, and the estimation accuracy of the SOC can be improved.

In the method disclosed in PTL 3 described above, one OCV curve is selected from the plurality of OCV curves using the current history. In contrast, in the present exemplary embodiment, the current history to silicon (Si) is estimated instead of the history of the measured observed current. This estimation is a principle based on the transient response principle, and can improve the estimation accuracy of the SOC.

In any of the methods disclosed in PTLs 1 to 3 described above, the OCV curve is selected or the transient characteristics are expressed using an observed current of a battery cell. In these methods, in the case of the lithium-ion battery cell using the mixed negative electrode of graphite (C) and silicon (Si), the current input/output to/from silicon (Si) cannot be correctly estimated, and the estimation accuracy of the SOC may sometimes decrease. In contrast, in the present exemplary embodiment, the electrode (negative electrode) in which the plurality of materials are mixed with one another is defined by the parallel circuit of the equivalent circuits of the respective materials (graphite (C), silicon (Si)), and accordingly, the current input/output to/from silicon (Si) can be correctly estimated, and the estimation accuracy of the SOC can be improved.

The present invention has been described above based on the exemplary embodiment. It will be understood by those skilled in the art that the exemplary embodiment is merely an example, that other exemplary modifications in which the respective constituent elements and processes of the exemplary embodiment are variously combined are possible, and that the other exemplary modifications still fall within the scope of the present invention.

In the above-mentioned exemplary embodiment, a necessary inductance component is not shown in the equivalent circuit model depending on the electrode body structure of the battery cell. However, when it is necessary to show an inductance component, for example, a configuration just needs to be adopted, in which the parallel circuit of inductance L and resistance R is connected in series to the positive electrode or the negative electrode.

In the above-mentioned exemplary embodiment, the mixed electrode is expressed by the parallel circuit of the equivalent circuits of the respective materials. Hence, the present invention is not limited to silicon (Si), and can be applied to any material as long as the material has a Q-OCV curve on the charge side and a Q-OCV curve on the discharge side, which are different from each other, and has hysteresis when switching between charge and discharge is performed.

In the above-mentioned exemplary embodiment, the lithium-ion battery cell using the mixed negative electrode of graphite (C) and silicon (Si) has been described as an example. The negative electrode material to be mixed is not limited to graphite (C) and silicon (Si). For example, sulfur (S), bismuth (Bi), lithium titanate (Li2TiO3), and the like can be used. Moreover, the materials to be mixed are not limited to two, and may be three or more. Even in this case, at least one material needs to be included, which has the Q-OCV curve on the charge side and the Q-OCV curve on the discharge side, which are different from each other, and has hysteresis when switching between charge and discharge is performed.

Furthermore, the mixed electrode is not limited to the negative electrode. The positive electrode may also be a mixed positive electrode in which two or more materials are mixed with one another. For example, as the positive electrode material, there can be used a material in which Ni, Mn is substituted for a part of lithium cobaltate (LiCoO2), lithium nickelate (LiNiO2), lithium manganate (LiMn2O4), lithium iron phosphate (LiFePO4), or lithium cobaltate of ternary lithium cobaltate (Li (Ni—Mn—Co)O2), or the like.

In the above-mentioned exemplary embodiment, the example in which the present invention is applied to battery system 2 for in-vehicle use has been described, but the present invention can also be applied to a battery system for use in a stationary power storage. Moreover, the present invention can also be applied to a battery system for use in an electronic device such as a notebook personal computer (PC) and a smartphone.

Note that the exemplary embodiment may be specified by the following items.

[Item 1]

Battery state estimation device (40) including;

voltage measuring unit (41) that measures a voltage of a battery cell (10);

current measuring unit (43) that measures a current flowing through battery cell (10); and controller (42) that estimates an open circuit voltage (OCV) of battery cell (10) based on a voltage measured by voltage measuring unit (41), a current measured by current measuring unit (43), and an equivalent circuit model based on electrochemistry of battery cell (10), and estimates a state of charge (SOC) of battery cell (10) based on the estimated OCV, SOC-OCV characteristics on a charge side of battery cell (10), and SOC-OCV characteristics on a discharge side of battery cell (10), wherein at least one of a positive electrode and negative electrode of battery cell (10) is a mixed electrode containing a plurality of materials, and controller (42) estimates a current flowing through a material in which capacity-OCV characteristics are different between the charge side and the discharge side, the material being included in the plurality of materials contained in the mixed electrode, and determines a ratio between the SOC-OCV characteristics on the charge side and the SOC-OCV characteristics on the discharge side based on the current.

According to this, the estimation accuracy of the SOC of battery cell (10) using the mixed electrode can be improved.

[Item 2]

Battery state estimation device (40) according to Item 1, wherein controller (42) estimates the SOC of battery cell (10) by performing, based on the ratio, a weighted average for an SOC obtained from the estimated OCV and the SOC-OCV characteristic on the charge side and an SOC obtained from the estimated OCV and the SOC-OCV characteristics on the discharge side.

According to this, the estimation accuracy of the SOC of battery cell (10) using the mixed electrode can be improved.

[Item 3]

Battery state estimation device (40) according to Item 1 or 2, wherein the negative electrode is a mixed negative electrode containing a plurality of materials, a negative electrode of the equivalent circuit model is expressed by a parallel circuit of equivalent circuits formed for each of the plurality of materials, each equivalent circuit includes an OCV and a diffusion resistance component, and by using the parallel circuit, controller (42) estimates the current flowing through the material in which the capacity-OCV characteristics are different between the charge side and the discharge side.

According to this, the current flowing through the material having different capacity-OCV characteristics between the charge side and the discharge side can be estimated with high accuracy, and the estimation accuracy of the SOC can be improved.

[Item 4]

Battery state estimation device (40) according to Item 1 or 2, wherein the negative electrode is a mixed negative electrode containing graphite and silicon, a negative electrode of the equivalent circuit model is expressed by a parallel circuit of an equivalent circuit of the graphite and an equivalent circuit of the silicon, the equivalent circuit of the graphite and the equivalent circuit of the silicon each include an OCV and a diffusion resistance component, and by using the parallel circuit, controller (42) estimates a current flowing through the silicon.

According to this, the current flowing through the silicon can be estimated with high accuracy, and the estimation accuracy of the SOC can be improved.

[Item 5]

A battery state estimation method including the steps of:
measuring a voltage of battery cell (10);
measuring a current flowing through battery cell (10); and
estimating an open circuit voltage (OCV) of battery cell (10) based on a voltage measured in the step of measuring the voltage, a current measured in the step of measuring the current, and an equivalent circuit model based on electrochemistry of battery cell (10), and estimating a state of charge (SOC) of battery cell (10) based on the estimated OCV, SOC-OCV characteristics on a charge side of battery cell (10), and SOC-OCV characteristics on a discharge side of battery cell (10),
wherein
at least one of a positive electrode and negative electrode of battery cell (10) is a mixed electrode containing a plurality of materials, and
the step of estimating the SOC estimates a current flowing through a material in which capacity-OCV characteristics are different between the charge side and the discharge side, the material being included in the plurality of materials contained in the mixed electrode, and determines a ratio between the SOC-OCV characteristics on the charge side and the SOC-OCV characteristics on the discharge side based on the current.

According to this, the estimation accuracy of the SOC of battery cell (10) using the mixed electrode can be improved.

[Item 6]

Battery system (2) including:
battery cell (10);
voltage measuring unit (41) that measures a voltage of battery cell (10);
current measuring unit (43) that measures a current flowing through battery cell (10); and
controller (42) that estimates an open circuit voltage (OCV) of battery cell (10) based on a voltage measured by voltage measuring unit (41), a current measured by current measuring unit (43), and an equivalent circuit model based on electrochemistry of battery cell (10), and estimates a state of charge (SOC) of battery cell (10) based on the estimated OCV, SOC-OCV characteristics on a charge side of battery cell (10), and SOC-OCV characteristics on a discharge side of battery cell (10),
wherein
at least one of a positive electrode and negative electrode of battery cell (10) is a mixed electrode containing a plurality of materials, and
controller (42) estimates a current flowing through a material in which capacity-OCV characteristics are different between the charge side and the discharge side, the material being included in the plurality of materials contained in the mixed electrode, and determines a ratio between the SOC-OCV characteristics on the charge side and the SOC-OCV characteristics on the discharge side based on the current.

According to this, battery system (2) in which the estimation accuracy of the SOC of battery cell (10) using the mixed electrode is improved can be achieved.

REFERENCE MARKS IN THE DRAWINGS

10 battery cell
20 power conversion device
30 load/power supply
1 electrified vehicle
2 battery system
3 battery module
6 charging cable
40 management unit
41 voltage measuring unit
42 controller
42*a* Q-OCV table
42*b* SOC-OCV table
43 current measuring unit
44 temperature measuring unit
20*a* inverter
30*a* motor
20*b* charger
30*b* commercial power system
RY1 first relay
RY2 second relay
Rsu shunt resistor

The invention claimed is:

1. A battery state estimation device comprising:
a voltage measuring unit that measures a voltage of a battery cell;
a current measuring unit that measures a current flowing through the battery cell; and
a controller that
estimates an open circuit voltage (OCV) of the battery cell based on the voltage measured by the voltage measuring unit, the current measured by the current measuring unit, and an equivalent circuit model based on electrochemistry of the battery cell, and
estimates a state of charge (SOC) of the battery cell based on (i) the estimated OCV, (ii) SOC-OCV characteristics on a charge side of the battery cell, and (iii) SOC-OCV characteristics on a discharge side of the battery cell,
wherein
at least one of a positive electrode and negative electrode of the battery cell is a mixed electrode containing a plurality of materials, and
the controller
estimates a current flowing through a material in which capacity-OCV characteristics are different between the charge side and the discharge side, the material being included in the plurality of materials contained in the mixed electrode, and
determines a ratio between the SOC-OCV characteristics on the charge side and the SOC-OCV characteristics on the discharge side based on the current.

2. The battery state estimation device according to claim 1, wherein the controller estimates the SOC of the battery cell by performing, based on the ratio, a weighted average for (i) an SOC obtained from the estimated OCV and the SOC-OCV characteristic on the charge side and (ii) an SOC obtained from the estimated OCV and the SOC-OCV characteristics on the discharge side.

3. The battery state estimation device according to claim 1, wherein
the negative electrode is a mixed negative electrode containing a plurality of materials,
a negative electrode of the equivalent circuit model is expressed by a parallel circuit of equivalent circuits formed for each of the plurality of materials,
each of the equivalent circuits includes an OCV and a diffusion resistance component, and
by using the parallel circuit, the controller estimates the current flowing through the material in which the capacity-OCV characteristics are different between the charge side and the discharge side.

4. The battery state estimation device according to claim 1, wherein
the negative electrode is a mixed negative electrode containing graphite and silicon,
a negative electrode of the equivalent circuit model is expressed by a parallel circuit of an equivalent circuit of the graphite and an equivalent circuit of the silicon,
the equivalent circuit of the graphite and the equivalent circuit of the silicon each include an OCV and a diffusion resistance component, and
by using the parallel circuit, the controller estimates a current flowing through the silicon.

5. A battery state estimation method comprising the steps of:
measuring a voltage of a battery cell;
measuring a current flowing through the battery cell; and
estimating an open circuit voltage (OCV) of the battery cell based on the voltage measured in the step of measuring the voltage, the current measured in the step of measuring the current, and an equivalent circuit model based on electrochemistry of the battery cell, and estimating a state of charge (SOC) of the battery cell based on the estimated OCV, SOC-OCV characteristics on a charge of the battery cell, and SOC-OCV characteristics on a discharge of the battery cell,
wherein
at least one of a positive electrode and negative electrode of the battery cell is a mixed electrode containing a plurality of materials, and
the step of estimating the SOC estimates a current flowing through a material in which capacity-OCV characteristics are different between the charge and the discharge, the material being included in the plurality of materials contained in the mixed electrode, and determines a ratio between the SOC-OCV characteristics on the charge and the SOC-OCV characteristics on the discharge based on the current.

6. A battery system comprising:
a battery cell;
a voltage measuring unit that measures a voltage of a battery cell;
a current measuring unit that measures a current flowing through the battery cell; and
a controller that estimates an open circuit voltage (OCV) of the battery cell based on the voltage measured by the voltage measuring unit, the current measured by the current measuring unit, and an equivalent circuit model based on electrochemistry of the battery cell, and estimates a state of charge (SOC) of the battery cell based on the estimated OCV, SOC-OCV characteristics on a charge of the battery cell, and SOC-OCV characteristics on a discharge of the battery cell,
wherein
at least one of a positive electrode and negative electrode of the battery cell is a mixed electrode containing a plurality of materials, and
the controller estimates a current flowing through a material in which capacity-OCV characteristics are different between the charge and the discharge, the material being included in the plurality of materials contained in the mixed electrode, and determines a ratio between the SOC-OCV characteristics on the charge and the SOC-OCV characteristics on the discharge based on the current.

\* \* \* \* \*